(12) United States Patent
Hill

(10) Patent No.: US 6,905,956 B2
(45) Date of Patent: Jun. 14, 2005

(54) MULTI-LAYER DIELECTRIC AND METHOD OF FORMING SAME

(75) Inventor: Chris W. Hill, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/992,462

(22) Filed: Nov. 16, 2001

(65) Prior Publication Data
US 2002/0061643 A1 May 23, 2002

Related U.S. Application Data

(62) Division of application No. 09/141,070, filed on Aug. 27, 1998.

(51) Int. Cl.[7] .............................................. H01L 21/4763
(52) U.S. Cl. ..................... 438/624; 438/435; 438/763; 438/778; 438/780; 438/784; 438/958; 438/981
(58) Field of Search ................................. 438/435, 624, 438/958, 763, 778, 780, 784, 981, 641, 643, 668, 257, 427, 424

(56) References Cited

U.S. PATENT DOCUMENTS

| | | | |
|---|---|---|---|
| 5,104,482 A | | 4/1992 | Monkowski et al. |
| 5,111,276 A | | 5/1992 | Hingarh et al. |
| 5,252,520 A | * | 10/1993 | Kocmanek et al. ......... 438/702 |
| 5,302,233 A | * | 4/1994 | Kim et al. ..................... 216/88 |
| 5,314,845 A | | 5/1994 | Lee et al. |
| 5,382,547 A | * | 1/1995 | Sultan et al. ................ 438/624 |
| 5,453,406 A | * | 9/1995 | Chen ........................... 438/763 |
| 5,543,633 A | * | 8/1996 | Losavio et al. ................ 257/48 |
| 5,563,104 A | * | 10/1996 | Jang et al. ................... 438/624 |
| 5,577,021 A | * | 11/1996 | Nakatani et al. ......... 369/275.2 |
| 5,607,773 A | | 3/1997 | Ahlburn et al. |
| 5,627,403 A | | 5/1997 | Bacchetta et al. |
| 5,656,337 A | * | 8/1997 | Park et al. ................... 427/539 |
| 5,656,556 A | * | 8/1997 | Yang ........................... 438/646 |
| 5,668,398 A | | 9/1997 | Havemann et al. |
| 5,674,783 A | | 10/1997 | Jang et al. |
| 5,679,606 A | | 10/1997 | Wang et al. |
| 5,716,890 A | | 2/1998 | Yao |
| 5,804,251 A | * | 9/1998 | Yu et al. ...................... 427/250 |
| 5,807,785 A | * | 9/1998 | Ravi ........................... 438/624 |
| 5,861,345 A | * | 1/1999 | Chou et al. ................. 438/763 |
| 5,908,672 A | | 6/1999 | Ryu et al. |
| 5,909,044 A | * | 6/1999 | Chakravarti et al. ........ 257/301 |
| 5,913,140 A | * | 6/1999 | Roche et al. ................ 438/624 |
| 5,914,518 A | * | 6/1999 | Nguyen et al. ............. 257/369 |
| 5,932,487 A | * | 8/1999 | Lou et al. .................... 438/692 |
| 5,946,592 A | * | 8/1999 | Lin ............................. 438/633 |
| 5,969,409 A | * | 10/1999 | Lin ............................. 257/637 |

(Continued)

FOREIGN PATENT DOCUMENTS

JP 2000114362 A 4/2000

*Primary Examiner*—Amir Zaradian
*Assistant Examiner*—Ida M. Soward
(74) *Attorney, Agent, or Firm*—Kirkpatrick & Lockhart; Nicholson Graham LLP

(57) ABSTRACT

A multiple dielectric device and its method of manufacture overlaying a semiconductor material, including a substrate, an opening relative to the substrate, the opening having an aspect ratio greater than about two, a first dielectric layer in the opening, wherein a portion of the opening not filled with the first dielectric layer has an aspect ratio of not greater than about two, and a second dielectric layer over said first dielectric layer. The deposition rates of the first and second dielectric layers may be achieved through changes in process settings, such as temperature, reactor chamber pressure, dopant concentration, flow rate, and a spacing between the shower head and the assembly. The dielectric layer of present invention provides a first layer dielectric having a low deposition rate as a first step, and an efficiently formed second dielectric layer as a second completing step.

32 Claims, 5 Drawing Sheets

U.S. PATENT DOCUMENTS

| | | | |
|---|---|---|---|
| 5,976,947 A | * 11/1999 | Reinberg | 438/424 |
| 6,004,873 A | * 12/1999 | Jang et al. | 438/618 |
| 6,020,265 A | * 2/2000 | Lou | 438/692 |
| 6,030,881 A | 2/2000 | Papasouliotis | |
| 6,072,223 A | 6/2000 | Noble | |
| 6,083,850 A | 7/2000 | Shields | |
| 6,093,637 A | * 7/2000 | Kishimoto et al. | 438/624 |
| 6,136,664 A | 10/2000 | Economikos et al. | |
| 6,136,685 A | 10/2000 | Narwankar et al. | |
| 6,171,885 B1 | * 1/2001 | Fan et al. | 438/70 |
| 6,184,158 B1 | * 2/2001 | Shufflebotham et al. | 438/788 |
| 6,194,283 B1 | 2/2001 | Gardner et al. | |
| 6,200,911 B1 | * 3/2001 | Narwankar et al. | 438/758 |
| 6,319,848 B1 | 11/2001 | Litwin et al. | |
| 6,667,553 B2 | * 12/2003 | Cerny et al. | 257/758 |
| 2001/0028075 A1 | * 10/2001 | Chen et al. | 257/296 |
| 2001/0055889 A1 | * 12/2001 | Iyer | 438/758 |
| 2002/0158339 A1 | * 10/2002 | Yamamoto | 257/758 |

* cited by examiner

MULTI-LAYER DIELECTRIC AND METHOD OF FORMING SAME

CROSS REFERENCE TO RELATED APPLICATIONS

This application is a division of co-pending application Ser. No. 09/141,070, filed Aug. 27, 1998.

STATEMENT REGARDING FEDERALLY SPONSORED RESEARCH OR DEVELOPMENT

Not Applicable.

BACKGROUND OF THE INVENTION

1. Field of the Invention

The present invention is directed, generally, to an assembly having a multi-layer dielectric and its method of manufacture.

2. Description of the Prior Art

Dielectric layers are very important in the production of integrated circuits because they provide an insulating barrier between conductive layers and protect the underlying layers from such things as impurities, moisture, and stress related impacts. It is desirable that the dielectric layer fill the spaces between the parallel conductors. Otherwise, voids left between the conductors can cause the circuit to fail for a variety of reasons, such as latent defects caused by impurities and moisture. Voids between the parallel conductors can also cause the circuits to fail due to electric shorts between structures formed subsequent to the dielectric deposition. Furthermore, certain dielectric characteristics cause undesirable effects, such as "cross talk" between parallel conductors of current. Accordingly, the quality of the dielectric layer is a factor in the reliability and performance of the integrated circuit.

FIG. 9 illustrates a dielectric formation problem known in the art known as "shadowing", wherein some areas in the openings 118 between the structures 112 are more prone to developing voids 110 during the formation of the dielectric layer 102, thereby resulting in a less effective integrated circuit. Various attempts have been made to reduce or eliminate shadowing, and thereby improve the overall quality of the dielectric layer.

It is known to form multiple dielectric layers to provide benefits not available with a single dielectric layer to improve dielectric quality. However, several deficiencies exist in the prior art. For example, it is known to form a multi-layer dielectric having an adhesive coating between each dielectric layer. The adhesive coating, however, introduces an additional step in the fabrication process, which reduces manufacturing efficiency and increases costs. Also, it is known to form three layers of dielectric material having varying degrees of quality and thickness, with the third top layer being relatively thick. Formation of a three layered dielectric, however, requires significant manufacturing time and cost, particularly when thickness and high quality are necessary characteristics of one of the layers.

Accordingly, the need exists for an improved multiple layer dielectric providing good gap-fill characteristics, whereby only two layers are needed, and an adhesive layer is not needed.

BRIEF SUMMARY OF THE INVENTION

The present invention is directed to an assembly having a substrate, an opening relative to the substrate, the opening having an aspect ratio greater than about two, a first dielectric layer in the opening wherein a portion of the opening not filled with the first dielectric layer has an aspect ratio of not greater than about two, and a second dielectric layer over the first dielectric layer. Reducing the aspect ratio of the opening by forming the first dielectric layer and completing the dielectric layer by forming the second dielectric layer may be achieved through changes in process settings, such as temperature, reactor chamber pressure, dopant concentration, flow rate, and spacing between the shower head and the assembly.

The present invention also includes a method of forming a dielectric layer in an opening having an aspect ratio of greater than about two comprising forming a first dielectric layer in the opening wherein a portion of the opening not filled with the first dielectric layer has an aspect ratio of not greater than two, and forming a second dielectric layer over the first dielectric layer.

The present invention also may be embodied in and used to form dielectrics associated with structures such as electrical conductors in integrated circuits, such as are used to form memory arrays, logic circuits, memory devices, processors, and systems.

The present invention solves problems experienced with the prior art because it combines both quality and efficiency in the forming process. The present invention provides a dielectric layer and method of manufacture comprising a first layer dielectric having improved gap-fill at a low deposition rate as a first step, and an efficiently formed second dielectric layer as a second completing step.

Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements. Those of ordinary skill in the art will recognize that other elements may be desirable and/or required in order to implement the present invention. However, because such elements are well known in the art, and because they do not facilitate a better understanding of the present invention, a discussion of such elements is not provided herein.

The present invention will be described in terms of a doped silicon semiconductor substrate, although advantages of the present invention may be realized using other structures and technologies, such as silicon-on-insulator, silicon-on-sapphire, and thin film transistor. The term substrate, as used herein, shall mean one or more layers or structures which may include active or operable portions of a semiconductor device formed on or in the substrate. A substrate is often, but not always, the lowest layer of material.

Figure 1:
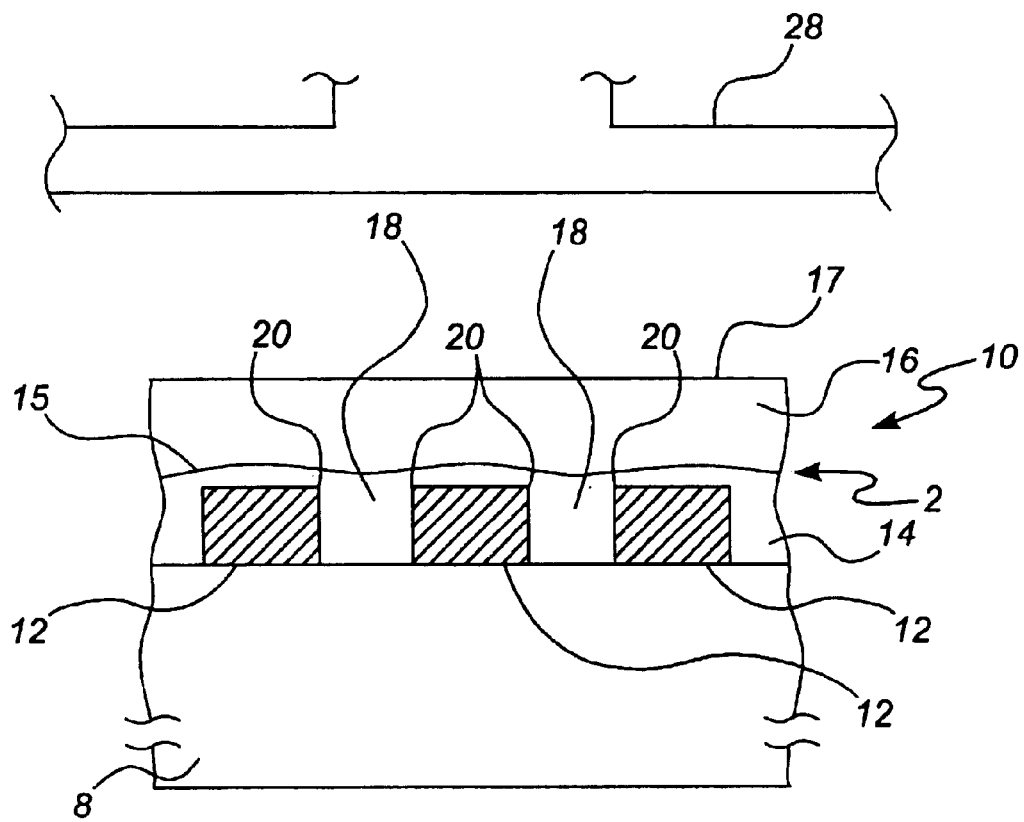
FIG. 1 is a cross-sectional view of a semiconductor of the present invention illustrating the dielectric layer of the present invention formed over a substrate.

FIG. 1 is a cross-sectional view of an assembly 10 including a number of structures 12 defining gaps or openings 18 formed on a substrate 8 and covered with a multilayer dielectric 2 including a first dielectric layer 14 and a second dielectric layer 16. The assembly 10 may be, for example, a portion of an integrated circuit, such as a portion of a memory array or a logic circuit, as may be used to form devices, such as memories and processors.

The structures 12 are illustrated as being stepped structures, although they may take other forms. In the illustrated embodiment, the structures 12 have edges 20 that define the opening 18. Although only two openings 18 are illustrated in the drawings, any number of openings 18 may be present on or in the substrate 8. The structures 12 may be, for example, conductive patterns formed directly on the substrate 8, and may be formed, for example, from any conductor of current, such as aluminum and polysilicon. The structures 12 may be formed, for example, by a deposition and etch process. For example, a layer of aluminum may be deposited over the entire substrate 8, such as by chemical vapor deposition (CVD) or by sputtering. The layer may be masked, such as with photoresist, and subjected to a selective etch. Thereafter, the photoresist may be removed to leave the structures 12 illustrated in FIG. 1.

Figure 3:
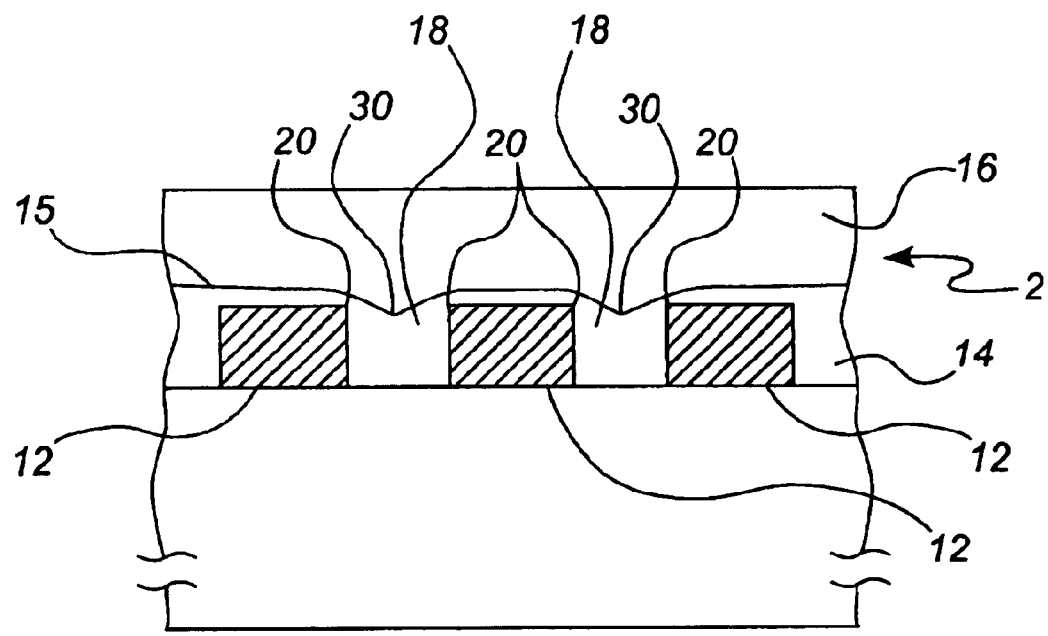
FIG. 3 is an alternate embodiment of the present invention illustrating a top surface of the first dielectric layer positioned below an edge of the structure formed over the substrate.
Figure 4:
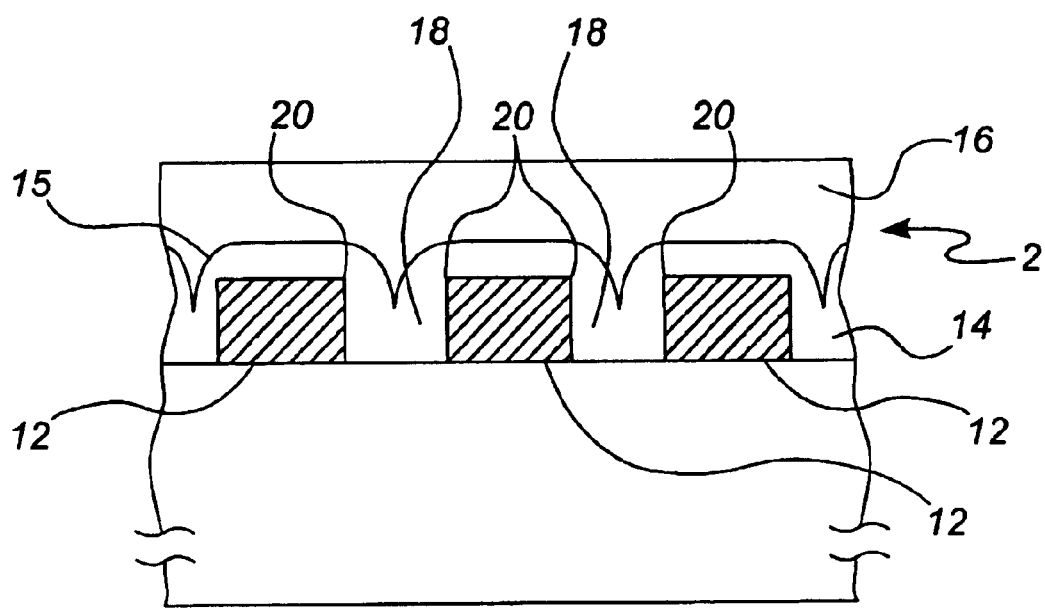
FIG. 4 is an alternate embodiment of the present invention illustrating a first dielectric layer formed below an edge of the structure which is formed over the substrate so that a portion of the opening not filled by the first dielectric layer has an aspect ratio of not greater than two.

The first dielectric layer 14 is formed with a relatively low deposition rate process and includes a top surface 15. The first dielectric layer 14 may partially fill the opening 18 or may completely fill the opening 18 and cover the edges 20. It has been discovered that openings 18 having aspect ratios greater than about two are difficult to fill at relatively high deposition rates and often suffer from shadowing effects. As described hereinbelow, however, the method of forming the first dielectric layer 14 provides good gap-fill characteristics, even at high aspect ratios of greater than about two. As a result, the first dielectric layer 14 may partially fill the opening 18 so that the effective aspect ratio of the opening 18 is less than about two, as illustrated in FIG. 4. The first dielectric layer 14 has desirable characteristics such as, for example, reducing "cross talk", thereby increasing reliability and performance. This benefit is realized when the opening 18 is completely or nearly completely filled, as illustrated in FIGS. 1 and 3, respectively.

The second dielectric layer 16 is formed with a higher deposition rate process than the first dielectric layer 14 to reduce processing time, and includes a top surface 17 that is above the opening 18. The second dielectric layer 16 may be formed at a higher deposition rate without producing undesirable gap-fill characteristics because the first dielectric layer 14 has either completely filled the opening 18 or has reduced the aspect ratio of the opening 18.

The first and second dielectric layers 14, 16 may be formed, for example, from silicon oxide, tetraethylorthosilicate (TEOS) oxide, silicon nitride, or oxynitride. The first and second dielectric layers 14, 16 may be formed, for example, through chemical vapor deposition (CVD) or sputtering. The relative deposition rates of the first and second dielectric layers 14, 16 may be controlled by changing one or more process settings during the formation of the dielectric layers 14, 16. The process settings include temperature, pressure, dopant concentration, TEOS and dopant flow rates, and spacing between the suseptor or shower head 28 and the assembly 10.

Several variables affect the gap-fill characteristics of the dielectric layer 2. For example, a deposition process using ozone and TEOS provides superior gap-fill properties over a process using hydride precursors such as silane and oxygen. It has been observed that some process conditions using ozone-TEOS deposition yield particularly good gap-fill results. For example, undoped films provide better gap-fill characteristics and create less voids than doped films. Also, high temperature and high pressure depositions provide better gap-fill characteristics than low temperature and low pressure depositions. In general, low deposition rate ozone-TEOS processes provide better gap-fill than high deposition rate processes.

Controlling pressure to regulate deposition rates for the first and second dielectric layers 14, 16 is particularly advantageous for purposes of the present invention because pressure change can be accomplished easily and quickly. Similarly, temperature may be controlled to regulate deposition rates, such as with rapid thermal processing (RTP) techniques.

Changes in the process settings influence the deposition flow rate of the first dielectric layer 14 in order to reduce the aspect ratio of the opening 18 to not greater than about two. The first dielectric layer 14 may be formed at the following chemical process settings in order to achieve low deposition rate: (1) a substrate temperature ranging from about 550° C. to about 600° C.; (2) a reactor chamber pressure ranging from about 400 torr to about 760 torr when employing TEOS; (3) a dopant concentration of boron ranging from about 3% to about 5% by weight, preferably ranging from about 3% to about 4% by weight, and of phosphorus ranging from about 5% to about 8% by weight, preferably ranging from about 5% to about 6% by weight; (4) a TEOS flow rate from about 100 mg/min to about 300 mg/min; and (5) a spacing between the shower head 28 and the assembly 10 ranging from about 250 mil to about 300 mil. The first layer 14 may be formed, for example, employing ozone-TEOS at a temperature of 575° C., a pressure of 600 torr, a boron and phosphorus weight percent of 3% and 8% respectively, a flow rate of 300 mg/min, and a shower head spacing of 275 mil. The first dielectric layer 14 may be formed at a deposition rate in the range of about 1,000 to about 2,000 Å/min when employing ozone and tetraethylorthosilicate (TEOS).

The second dielectric layer 16 may be formed at the following process settings in order to achieve high deposition rate: (1) a substrate temperature ranging from about 400° C. to about 500° C.; (2) a reactor chamber pressure ranging from about 100 torr to about 300 torr when employing TEOS; (3) a dopant concentration of boron ranging from about 3% to about 5% by weight, preferably ranging from about 4% to about 5% by weight, and of phosphorus ranging from about 5% to about 8% by weight, preferably ranging from about 7% to about 8% by weight; (4) a TEOS flow rate from about 600 mg/min to about 700 mg/min; and (5) a spacing between the shower head 28 and the assembly 10 ranging from about 175 mil to about 200 mil. The second layer 16 may be formed, for example, employing TEOS at a temperature of 480° C., a pressure of 200 torr, a boron and phosphorus weight percent of 3% and 8% respectively, a flow rate of 600 mg/min, and a shower head spacing of 200 mil. Advantages of the present invention may be realized from a single change in a single process parameter or as a combination of changes in two or more process parameters from the formation of the first dielectric layer 14. The second dielectric layer 16 may be formed at a deposition rate in the range of about 2,500 to about 4,000 Å/min. when employing ozone and TEOS.

Planarization may occur after formation of the first dielectric layer 14, after formation of the second dielectric layer 16, or both. For example, mechanical abrasion, such as chemical-mechanical planarization (CMP), and reactive ion etch (RIE) etch-back planarizing are particularly useful in preparing the dielectric layer 2 of the present invention for subsequent processing steps.

Figure 2:
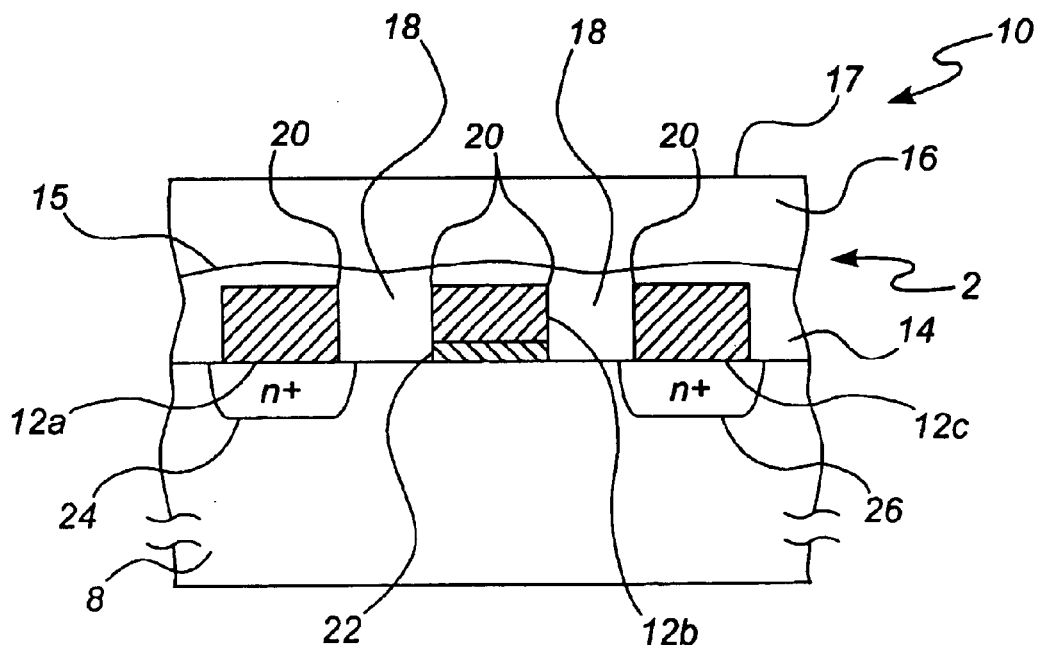
FIG. 2 is a cross-sectional view of an alternate embodiment of the dielectric layer of FIG. 1 formed over a gate electrode.

FIG. 2 illustrates the assembly 10 in the form of a MOS transistor. The structures 12a, 12b, 12c are contacts to source, gate, and drain portions, respectively, of the transistor 10. A gate oxide 22 is under the gate contact 12b, and doped regions 24, 26 are formed in the substrate 8 under the source and drain contacts 12a, 12c, respectively. The assembly 10 may also be used, for example, to form capacitors and in memory arrays and logic arrays, such as may be used to form memory devices and processors.

FIG. 3 illustrates another embodiment of the present invention wherein the top surface 15 of the first dielectric layer 14 is below the top edge 20 of the structures 12, although still substantially filling the openings 18 therebetween. The second dielectric layer 16 is formed over and adjacent to the first dielectric layer 14. Although it is particularly beneficial to form the first dielectric layer 14 that fills the openings 18 between the structures 12 so that its top surface 15 completely covers the top edge 20, as described above, it is contemplated that either by design or due to manufacturing variations, the top surface 15 of the first dielectric layer 14 may fall below the edges 20 of the structures 12 at various cross-sectional points along the top surface 15. In those situations, the first dielectric layer 14 will still provide a high quality protective and insulating layer between the structures 12. The slight depressions 30 that fall below the edges 20 of the structures 12 would be covered and filled by the second dielectric layer 16, and would not adversely effect the overall performance of the dielectric layer 2. Furthermore, because the slight depressions 30 have an aspect ratio of less than about two, they can be effectively filled by the second dielectric layer 16.

FIG. 4 illustrates another embodiment of the present invention wherein the top surface 15 of the first dielectric layer 14 is substantially below the top edge 20 of the structures 12, so that the portion of the opening 18 not filled by the first dielectric layer 14 has an aspect ratio greater than the slight depressions 30 illustrated in FIG. 3, but still not greater than about two. The first dielectric layer 14 is formed at a low deposition rate that provides good surface mobility that reduces or eliminates voids as a result of the shadowing effect. The second dielectric layer 16 is formed over and adjacent to the first dielectric layer 14 at a high deposition rate to complete the forming process. The second dielectric layer 14 may be formed quickly to reduce the manufacturing time and cost.

In operation, the present invention provides a dielectric layer 2 comprising a first dielectric layer 14 formed at a low deposition rate, and a second dielectric layer 16 formed at a higher deposition rate. The first dielectric layer 14 formed at the low deposition rate and process setting ranges described above provide good gap-fill characteristics during the first step when the impingement rate is low so that voids between the structures 12 due to the shadowing effect are either eliminated or greatly reduced. As a result, the first dielectric layer 14 provides improved protective, insulating and capacitive qualities in the critical gap areas between the structures 12 where it is most beneficial, to protect the circuit from impurities, moisture, and stress related impacts. After the first dielectric layer is deposited using a low deposition rate process, and the spaces between the structure 12 are either partially or completely filled, the second dielectric layer 16 is deposited at a high deposition rate, thereby saving manufacturing time and cost.

In addition, the present invention provides a method of forming the multi-layer dielectric in openings 18 formed relative to the substrate 8. The first dielectric layer 14 is formed in an opening 18 having an aspect ratio greater than about two at the relatively low deposition rate to substantially cover the openings 18 between the structures 12 via the first set of process settings provided above. The second dielectric layer 16 is then formed over and adjacent to the first dielectric layer 14 at the relatively high deposition rate via the second set process settings provided above. The top surface 17 of the second dielectric layer 16 covers the opening 18 and completes the formation process.

The same method described above is used to form the dielectric layer 2 illustrated in FIG. 3 but for the top surface 15 of the first dielectric layer 14 being partially below the top edges 20 of the structures 12 at various cross-sectional points along the top surface 15. In like manner, the same method described above is used to form the dielectric layer 2 illustrated in FIG. 4, but the first dielectric layer 14 is formed in an opening 18 having an aspect ratio greater than about two so that a portion of the opening 18 not filled by the first dielectric layer 14 has an aspect ratio not greater than about two.

EXAMPLES

Figure 5:
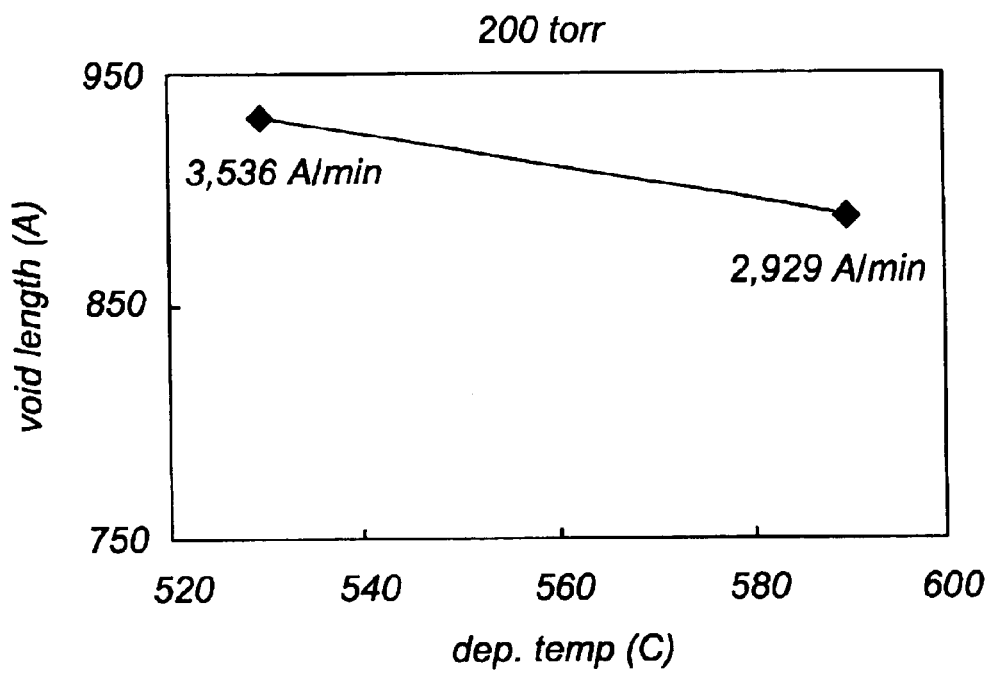
FIG. 5 illustrates the relationship between average void length and deposition temperature is for 6.9% PSG at 200 torr.
Figure 6:
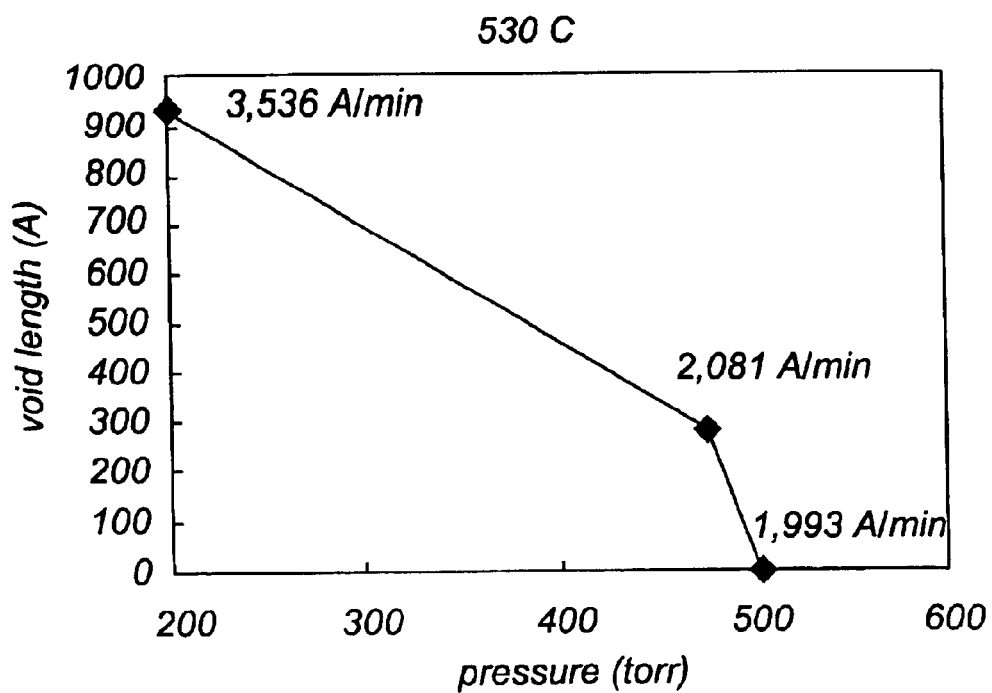
FIG. 6 illustrates the relationship between average void length and deposition pressure for 6.9 PSG at 530° C.
Figure 7:
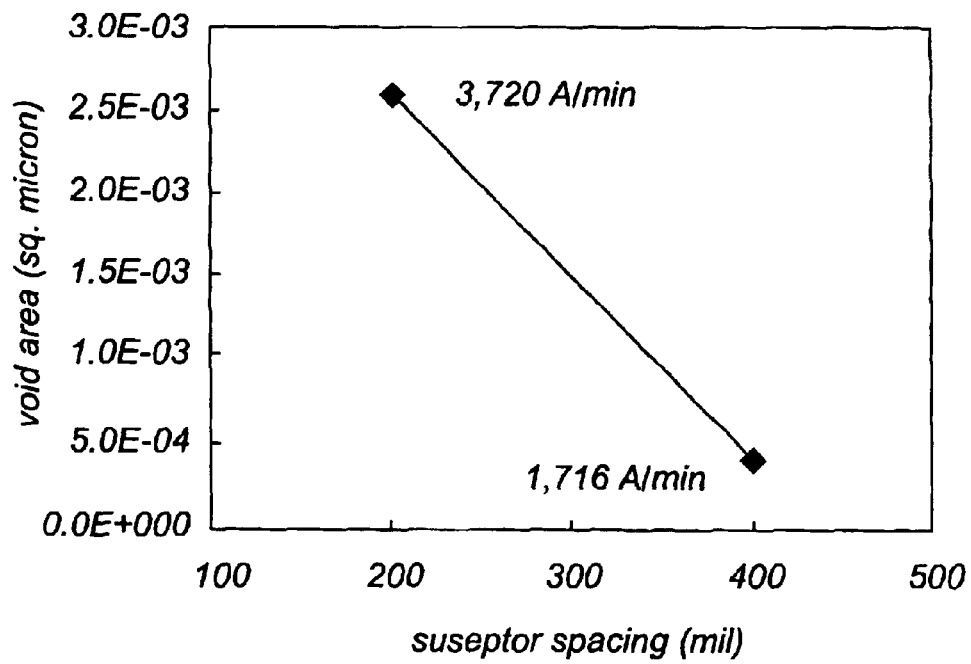
FIG. 7 illustrates the relationship between average void area and suseptor spacing for 2.7×7.2 BPSG.

The below examples are provided to show the relationship between various process conditions and void sizes measured in scanning electron microscope (SEM) cross-sections for phosphosilicate glass (PSG) and borophosphosilicate glass (BPSG) films deposited under a variety of conditions. FIG. 5 shows the average void length versus deposition temperature for 6.9% PSG at 200 torr. FIG. 6 shows the average void length versus deposition pressure for 6.9 PSG at 530° C. FIG. 7 shows the average void area versus suseptor spacing for 2.7×7.2 BPSG. In each of FIGS. 5–7, all other deposition parameters were held constant. FIGS. 5–7 show that processes having lower deposition rates have better gap-fill characteristics (smaller voids) than processes with higher deposition rates.

Figure 8:
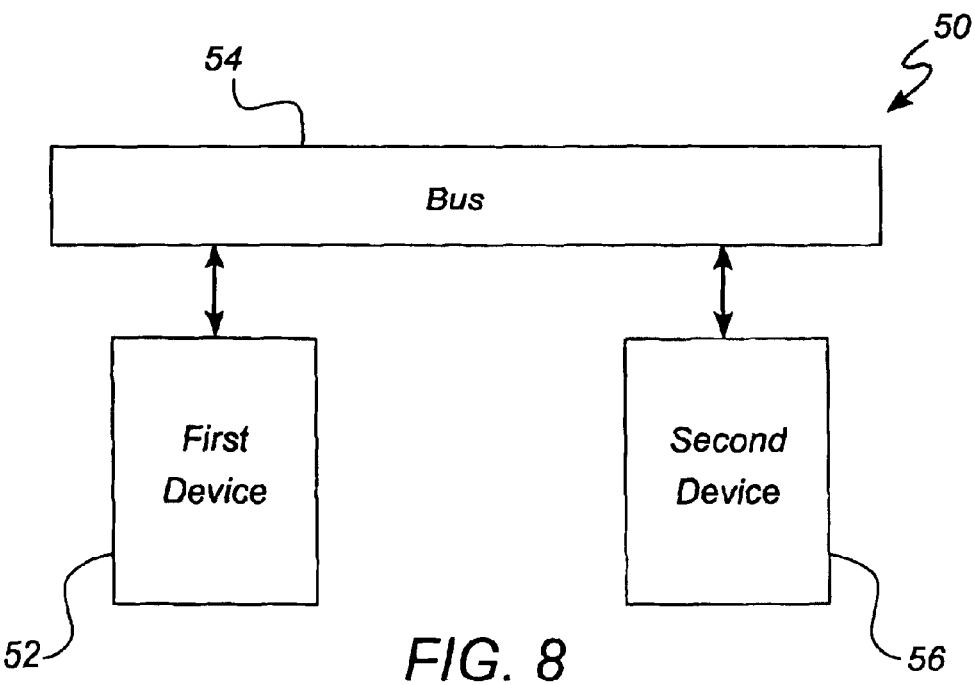
FIG. 8 is a high level block diagram illustrating a system utilizing the dielectric layer of the present invention.
Figure 9:
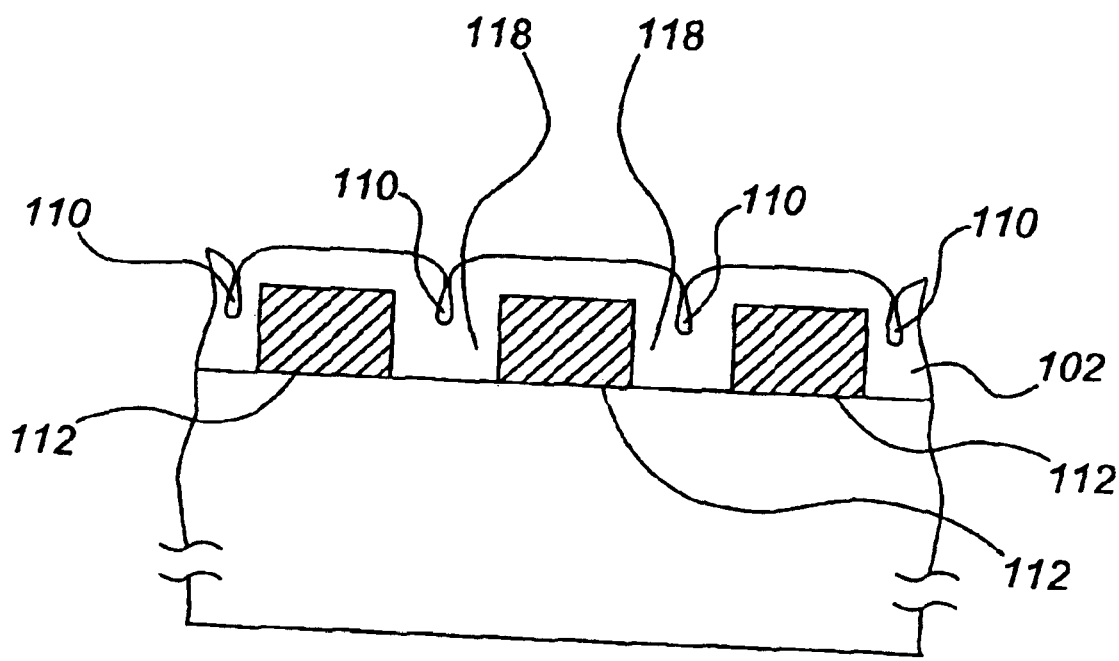
FIG. 9 illustrates a prior art dielectric layer formation wherein a sizable void is formed in the opening due to the shadowing effect.

FIG. 8 is a high level block diagram illustrating a system 50 including a first device 52, a bus 54, and a second device 56. The system 50 may be, for example, a memory system or a computer system. The first device 52 may be a processor, and the second device 56 may be a memory. The first device 52 and the second device 56 may communicate via the bus 54. The first and second devices 52, 56 may include assemblies, such as conductors, including dielectrics formed according to the teaching of the present invention, that may be used to form memory arrays and logic circuits.

Those of ordinary skill in the art will recognize that many modifications and variations of the present invention may be implemented. The foregoing description and the following claims are intended to cover all such modifications and variations.

What is claimed is:

1. A method of forming a dielectric layer in an opening, comprising:
    forming a first dielectric layer at a first deposition rate in the opening, the opening having an aspect ratio greater than about two, and wherein a portion of the opening not filled with said first dielectric layer has an aspect ratio of not greater than about two; and
    forming a second dielectric layer at a second deposition rate greater than the first deposition rate over the first dielectric layer, the second layer filling the portion of the opening not filled with the first dielectric layer and having a top surface that is not within the opening such that voids are substantially not present in the opening.

2. The method of claim 1, further comprising providing a substrate before forming the opening.

3. The method of claim 2, wherein providing the substrate includes providing a substrate selected from the group consisting of a silicon substrate, an insulator substrate, and a sapphire substrate.

4. The method of claim 1, wherein forming a first dielectric layer includes forming the first dielectric layer having a top surface that is not within the opening.

5. The method of claim 1, wherein forming a first dielectric layer includes forming the first dielectric layer having a top surface that is within the opening.

6. The method of claim 1, wherein:
    forming a first dielectric layer includes forming the first dielectric layer through an ozone-TEOS deposition; and
    forming a second dielectric layer includes forming the second dielectric layer through an ozone-TEOS deposition.

7. The method of claim 1, wherein:
    forming a first dielectric layer includes forming the first dielectric layer at a first process setting; and
    forming a second dielectric layer includes forming the second dielectric layer at a second process setting at a predetermined relationship with the first process setting.

8. The method of claim 7, wherein the first process setting and the second process setting are selected from the group consisting of temperature, reactor chamber pressure, dopant concentration, flow rate, and shower head spacing.

9. The method of claim 1, wherein:
    forming a first dielectric layer includes forming the first dielectric layer at a first temperature; and
    forming a second dielectric layer includes forming the second layer at a second temperature, the second temperature being less than the first temperature.

10. The method of claim 1, wherein:
    forming a first dielectric layer includes forming the first dielectric layer at a first pressure; and
    forming a second dielectric layer includes forming the second dielectric layer at a second pressure, the second pressure being greater than the first pressure.

11. The method of claim 1, wherein:
    forming a first dielectric layer includes forming the first dielectric layer at a first dopant concentration; and
    forming a second dielectric layer includes forming the second layer at a second dopant concentration, the first dopant concentration being less than the second dopant concentration.

12. The method of claim 1, wherein:
    forming a first dielectric layer includes forming the first dielectric layer at a first total TEOS and dopant flow rate; and
    forming a second dielectric layer includes forming the second layer at a second total TEOS and dopant flow rate, the first total TEOS and dopant flow rate being less than the second total TEOS and dopant flow rate.

13. The method of claim 1, wherein:
    forming a first dielectric layer includes:
        providing a shower head at a first distance from the substrate, and
        providing through the shower head constituents forming the first layer; and
    forming the second dielectric layer includes:
        providing the shower head at a second distance from the substrate, the second distance lower than the first distance, and
        providing through the shower head constituents forming the second layer.

14. A method of forming a dielectric layer during the manufacture of a semiconductor device, comprising:
    providing a substrate;
    forming an opening relative to the substrate, the opening having an aspect ratio greater than about two;
    forming a first dielectric layer at a first deposition rate in the opening wherein a portion of the opening not filled with said first dielectric layer has an aspect ratio of not greater than about two; and
    forming a second dielectric layer at a second deposition rate greater than the first deposition rate over the first dielectric layer, the second layer filling the portion of the opening not filled with the first dielectric layer and having a top surface that is not within the opening such that voids are substantially not present in the opening.

15. The method of claim 14, wherein forming an opening includes forming an opening in the substrate.

16. The method of claim 14, wherein forming an opening includes forming an opening on the substrate.

17. The method of claim 14, wherein forming an opening includes forming a plurality of structures on the substrate so that said plurality of structures forms an opening.

18. The method of claim 17, wherein forming a plurality the structures includes forming a plurality of conductors.

19. A method of forming a dielectric layer in an opening, comprising:
    forming a first dielectric layer at a first deposition rate in the opening, the first layer having a first process setting; and
    forming a second and final dielectric layer at a second deposition rate greater than the first deposition rate over the first dielectric layer, at least one of the first and the second layer filling the opening such that voids are substantially not present in the opening, the second layer having a top surface that is not within the opening and having a second process setting at a predetermined relationship with the first process setting.

20. The method of claim 19, wherein the first process setting and the second process setting are selected from the group consisting of temperature, reactor chamber pressure, dopant concentration, flow rate, and shower head spacing.

21. The method of claim 19, wherein the first process setting includes a first temperature, and the second process setting includes a second temperature, the first temperature being greater than the second temperature.

22. The method of claim 19, wherein the first process setting includes a first pressure, and the second process setting includes a second pressure, the first pressure being greater than the second pressure.

23. The method of claim 19, wherein the first process setting includes a first dopant concentration, and the second process setting includes a second dopant concentration, the first dopant concentration being less than the second dopant concentration.

24. The method of claim 19, wherein the first process setting includes a first flow rate, and the second process setting includes a second flow rate, the first flow rate being less than the second flow rate.

25. The method of claim 19, wherein the first process setting includes:
providing a shower head at a first distance from the substrate, and
providing through the shower head constituents forming the first layer; and
said second process setting includes:
providing the shower head at a second distance from the substrate, the second distance lower than the first distance, and
providing through the shower head constituents forming the second layer.

26. A method of forming a dielectric layer in an opening, comprising:
forming a first dielectric layer at a first deposition rate completely filling the opening, the opening having an aspect ratio greater than about two; and
forming a second and final dielectric layer at a second deposition rate greater than said first deposition rate over the first dielectric layer such that voids are substantially not present in the opening.

27. A method of forming a dielectric layer in an opening, comprising:
forming a first dielectric layer at a first deposition rate in the opening, the first layer being formed at a first temperature; and
forming a second and final dielectric layer at a second deposition rate greater than the first deposition rate over the first dielectric layer, at least one of the first layer and the second layer filling the opening such that voids are substantially not present in the opening, the second layer having a top surface that is not within the opening and being formed at a second temperature, the first temperature being greater than the second temperature.

28. A method of forming a dielectric layer in an opening, comprising:
forming a first dielectric layer at a first deposition rate in the opening, the first layer being formed at a first pressure; and
forming a second and final dielectric layer at a second deposition rate greater than the first deposition rate over the first dielectric layer, at least one of the first layer and the second layer filling the opening such that voids are substantially not present in the opening, the second layer having a top surface that is not within the opening and being formed at a second pressure, the first pressure being greater than the second pressure.

29. A method of forming a dielectric layer in an opening, comprising:
forming a first dielectric layer at a first deposition rate in the opening, the first layer having a first dopant concentration; and
forming a second and final dielectric layer at a second deposition rate greater than the first deposition rate over the first dielectric layer, at least one of the first layer and the second layer filling the opening such that voids are substantially not present in the opening, the second layer having a top surface that is not within the opening and having a second dopant concentration, the first dopant concentration being less than the second dopant concentration.

30. A method of forming a dielectric layer in an opening, comprising:
forming a first dielectric layer at a first deposition rate in the opening, the first layer being formed at a first flow rate; and
forming a second and final dielectric layer at a second deposition rate greater than the first deposition rate over the first dielectric layer, at least one of the first layer and the second layer filling the opening such that voids are substantially not present in the opening, the second layer having a top surface that is not within the opening and being formed at a second flow rate, the first flow rate being less than the second rate.

31. A method of forming a dielectric layer in an opening, comprising:
forming a first dielectric layer at a first deposition rate in the opening, said forming the first layer including:
providing a shower head at a first distance from the substrate, and
providing through the shower head constituents forming the first layer; and
forming a second and final dielectric layer at a second deposition rate greater than the first deposition rate over the first dielectric layer, at least one of the first layer and the second layer filling the opening such that voids are substantially not present in the opening, the second layer having a top surface that is not within the opening, said forming the second layer including:
providing the shower head at a second distance from the substrate, the second distance lower than the first distance, and
providing through the shower head constituents forming the second layer.

32. A method of forming a dielectric layer in an opening, comprising:
forming a first dielectric layer through an ozone-TEOS deposition at a first deposition rate in the opening, the first layer having a first process setting; and
forming a second and final dielectric layer through an ozone-TEOS deposition at a second deposition rate greater than the first deposition rate over the first dielectric layer, at least one of the first and the second layer filling the opening such that voids are substantially not present in the opening, the second layer having a top surface that is not within the opening and having a second process setting at a predetermined relationship with the first process setting.

* * * * *

UNITED STATES PATENT AND TRADEMARK OFFICE
CERTIFICATE OF CORRECTION

| | | |
|---|---|---|
| PATENT NO. | : 6,905,956 B2 | Page 1 of 1 |
| APPLICATION NO. | : 09/992462 | |
| DATED | : June 14, 2005 | |
| INVENTOR(S) | : Chris W. Hill | |

It is certified that error appears in the above-identified patent and that said Letters Patent is hereby corrected as shown below:

Column 2, line 56, delete "is" in brief description of FIG.5.

Signed and Sealed this

Eighth Day of August, 2006

JON W. DUDAS
*Director of the United States Patent and Trademark Office*